United States Patent [19]

Katznelson et al.

[11] Patent Number: 5,736,858
[45] Date of Patent: Apr. 7, 1998

[54] MODULAR WHOLE-BODY GRADIENT COIL COMPRISING FIRST AND SECOND GRADIENT COILS HAVING LINEAR GRADIENTS IN THE SAME DIRECTION

[75] Inventors: Ehud Katznelson, Ramat Yishai; Paul R. Harvey, Ramot Hashavin, both of Israel

[73] Assignee: Elscint Ltd., Haifa, Israel

[21] Appl. No.: 738,579

[22] Filed: Oct. 29, 1996

Related U.S. Application Data

[63] Continuation of Ser. No. 335,340, Nov. 3, 1994, abandoned.

[51] Int. Cl.⁶ .................................. G01V 3/00; G01V 3/14
[52] U.S. Cl. ........................................ 324/318; 324/322
[58] Field of Search .............................. 324/307, 308, 324/313, 319, 318, 320, 322

[56] References Cited

U.S. PATENT DOCUMENTS

| | | | |
|---|---|---|---|
| 4,165,479 | 8/1979 | Mansfield . | |
| 4,794,338 | 12/1988 | Roemer et al. | 324/318 X |
| 5,077,524 | 12/1991 | Hurd | 324/318 |
| 5,083,085 | 1/1992 | Morad | 324/318 |
| 5,177,441 | 1/1993 | Morich et al. | 324/318 |
| 5,235,279 | 8/1993 | Kaufman | 324/318 X |
| 5,266,913 | 11/1993 | Chapman | 324/307 X |
| 5,304,933 | 4/1994 | Vavrek et al. | 324/318 |
| 5,311,134 | 5/1994 | Yamagata et al. | 324/318 |
| 5,311,135 | 5/1994 | Vavrek | 324/318 |
| 5,349,774 | 9/1994 | Takahashi | 324/318 X |
| 5,406,205 | 4/1995 | Müller | 324/318 |
| 5,481,191 | 1/1996 | Rzedzian | 324/318 |
| 5,568,051 | 10/1996 | Yamagata | 324/318 |
| 5,570,021 | 10/1996 | Dachniwskyj et al. | 324/318 |

*Primary Examiner*—Sandra L. O'Shea
*Assistant Examiner*—Mack Haynes
*Attorney, Agent, or Firm*—Greenblum & Bernstein P.L.C.

[57] ABSTRACT

An MRI system incorporating modular whole body gradient coils that can selectively be used for conventional imaging or for ultra-fast imaging. A central modular coil is used alone for the ultra-fast imaging or used in combination with a modular flanking coil for conventional imaging.

17 Claims, 6 Drawing Sheets

MODULAR WHOLE-BODY GRADIENT COIL COMPRISING FIRST AND SECOND GRADIENT COILS HAVING LINEAR GRADIENTS IN THE SAME DIRECTION

This application is a continuation of application Ser. No. 08/335,340, filed Nov. 3, 1994, now abandoned.

FIELD OF THE INVENTION

This invention relates in general to magnetic resonance imaging (MRI) systems. It more particularly relates to an improved MRI system incorporating whole-body gradient coils that can be used either for conventional imaging or for ultra-fast imaging.

BACKGROUND OF THE INVENTION

Among the basic components of whole-body (MRI) systems are the gradient coils. These coils are usually wound on a cylindrical former which is then positioned within the bore of the whole-body magnet. The inner diameter of the coil former is small enough to enable effective use of the whole-body RF coil placed thereon and large enough to enable access to the patient who is in the interior of the former.

As is well known, to perform MRI in both two dimensions and three dimensions it is necessary that the coil former contains gradient coils appropriate to three orthogonal normal axes, i.e. the X, Y and Z axes. The X and Y gradient coils are usually longitudinally symmetrical about the X axis and the Y axis respectively. These coils are also separated symmetrically by the Y and X axes respectively. That is the X gradient coils are bisected by projections of the X axis and the Y gradient coils are bisected by projections of the Y axis. The X gradient coils are separated and equidistantly spaced from projections of the Y axis. They are also equidistantly spaced from the junction of the X, Y and Z axes. Similarly, the Y gradient coils are separated and equidistantly spaced from the X axis and equidistantly spaced from the junction of the X, Y and Z axes. The X gradient coil and the Y gradient coil can be simple coils or, more often distributed saddle type coils. The Z gradient coils, on the other hand, are separated from and equidistant to the X and the Y axes and are symmetrical about the Z axis. The Z gradient coils can be either simple pairs or distributed Maxwell pairs of coils. These are the primary gradient coils.

In addition to the primary gradient coils a further set of secondary coils wound on a cylindrical former concentric but external to the primary coils, is often used in order to reduce the generation of eddy currents within the MRI magnetic system. The eddy currents, as is well known, degrade image quality. The second set of outer coils are generally referred to as "screen coils" or "a screen".

Theoretical techniques exist to optimize the shape of the flux distribution of each set of gradient coils in order to optimize both the linearity of the gradient fields over a large volume and the efficiency of the gradient coils. In practice, there is always a trade-off between linearity and efficiency because of the gradient driver capabilities. Efficiency generally means, the energy efficiency; that is the number of gradient lines per unit current.

For conventional imaging it is usual to specify linear gradient fields over a central volume that is approximately 50 cm in diameter and has a length of up to approximately 60 cm. The linearity of the gradient fields within the central volume for conventional MRI are specified to be within plus or minus 5%. A large volume in the axial direction is required for certain MRI applications such as the imaging of the spine, where linear gradients are required over the length of the spine. It is generally sufficient to drive such gradient coils with conventional amplifiers that can provide 250 A at 150 V. This is sufficient since in most conventional scans, maximum gradient fields of only 10 mT/m are required with slow rated of 10 mT/m/ms.

Suppliers and users of magnetic resonance imaging systems are opting more and more for ultra-fast MRI. In ultra-fast MRI systems a complete MRI image can be acquired in less than 1 second. A particular technique which is used to acquire images in less than 100 ms is the Echo-Planar Imaging (EPI) technique which was first suggested by Peter Mansfield, (see his U.S. Pat. No. 4,165,479). For such techniques, the performance of the gradient coils in providing peak gradient fields and in providing the slow rate has to be better—in some cases by a whole order of magnitude—than the gradient fields used for regular imaging. A typical requirement for EPI gradient performance is 30 mT/m peak gradient with a slow rate of 180 mT/m/ms.

When a single gradient coil is used for both EPI and for conventional scans serious problems arise. Among other things, the larger the linear volume of the coil, the less efficient is the coil, since coil efficiency is inversely related to the volume of the coil. In addition, the inductance of such coils tend to be large and ultimately limit the slow rate attainable with conventional amplifiers. Therefore, when ultra-fast MRI is used, the inductance of the large coils tends to degrade the ultra-fast operation of the coil and, accordingly, for the ultra-fast operation, expensive additional apparatus is required such as special amplifiers and special switches, for example.

One solution to overcoming the loss of efficiency is the use of semi-conductor resonant switches. By making the gradient coil part of a tuned resonance circuit it is possible to take advantage of the energy conserving operation in a controlled manner using semi-conductor switching devices and high voltage power supplies. This approach enables the requisite performance but on large volume coils in creases the Bpk and the dBpk/dt—the peak magnetic field due to the gradient coil and the time derivative of the peak magnetic field respectively. For safety purposes it is important to restrict the level of Bpk and, therefore, dBpk/dt to which the patient is exposed.

Also, where gradient coils with large linear volumes are used, it is unavoidable that the rate of magnetic field change in certain parts of the coil is higher than that required for imaging. Accordingly, it is inherent in such designs that large components of the gradient field exist outside the desired linear region. Depending upon coil design, these large components can and generally do exceed the maximum gradient field specification for the imaging volume. If Bpk or the derivative with respect to time of certain components of these gradient fields reaches a high enough value during the scan then it is possible to elicit peripheral nerve stimulation in the patient under diagnosis. This is a highly undesirable and in fact prohibited side effect.

It is an object of the present invention overcome the above enumerated and other shortcomings that arise when using the same coil for both conventional imaging and for ultra-fast imaging in magnetic resonance imaging systems.

Efficiency is inversely proportioned to linear volume so that a way to improve efficiency of the gradient coil is to reduce its volume. This can be achieved by reducing either the diameter, the length of the linear region or both. However, since the patient must fit into the coil it is not practical to reduce the diameter. The length of the coil is reducible. In addition if the length of the linear volume is limited then the peak fields that occur outside the region will also be proportionately lower thereby lessening the likelihood of inducing peripheral nerve stimulation. A problem, however, with this simple approach is that the facility to image anatomy requiring large linear volumes (such as the spine) is removed. The gradient coil is then only useful for ultra-fast imaging of small regions of interest.

BRIEF SUMMARY OF THE INVENTION

To overcome the above enumerated problems in accordance with the present invention gradient coils are designed in modular form to provide a gradient coil of high efficiency and a tailored usable volume. The modular gradient coil comprises a central coil of high efficiency and a limited usable volume. To this central coil correction coils are added which modify the field profile to increase the usable volume. Thus, the coil works in two modes. In a high speed mode just a central portion of the coil is enabled to make efficient use of available amplifier power and to enable fast switching of gradient fields while limiting the level of exposure of the patient to Bpk and rapidly varying differential magnetic fields (dBpk/dt's). When the conventional mode of operation is required then the central portion of the coil together with correction coils are driven to enable large volume coverage for conventional imaging at a reduced slow rate.

More particularly, in accordance with one aspect of the present invention, an MRI system is provided comprising:

a magnet for supplying a homogeneous static magnetic field to align spins in a patient positioned in the static magnetic field, a radio frequency transmitter for generating signals at Larmor frequencies, radio frequency coil apparatus for transmitting said radio frequency signals to encompass said patient to tip said aligned spins to have at least a projection on a plane normal to the static magnetic field, X, Y and Z gradient coils for applying X, Y and Z gradients to the static magnetic field to enable position encoding of free induction decay (FID) signals that are emitted by the tipped spins after removal of the radio frequency signal, at least one of said X, Y and Z gradient coils comprising at least one modular set of gradient coils, said radio frequency coil apparatus also receiving said FID signals, signal processing means for processing said FID signals received by the radio frequency coil apparatus to obtain image data, image display means for displaying images in response to said image data, and a first modular gradient coil of said at least one set of modular gradient coils constructed and arranged to provide a first region having substantially linear gradients within said static magnetic field for use in ultra-fast MRI, a second modular gradient coil of said at least one set of modular gradient coils constructed and arranged to provide a second region within the static magnetic field having substantially linear gradients for use in conventional MRI, said second linear region being larger than said first linear region.

A further feature of the invention couples the first and second of said modular gradient coils serially to the same power supply and/or features winding both said first and said second of said modular gradient coils on the same former.

Yet a further feature of the invention includes the use of screen coils external to said modular gradient coils; said screen coils having a larger diameter than said gradient coils and also being modular.

Still a further feature of the invention includes said first and second modular gradient coils having different diameters. For conventional operation in imaging, both modular gradient coils are used and for ultra-fast operation only the first modular gradient coil is used. When both modular gradient coils are used then there is a larger volume wherein linear gradients are obtained.

The above mentioned as well as other objects and advantages of this invention will be more completely understood and appreciated from a study of the following detailed description of the presently preferred exemplary embodiment taken in conjunction with the accompanying drawings, in which.

A DETAILED DESCRIPTION OF THE INVENTION

Figure 1:
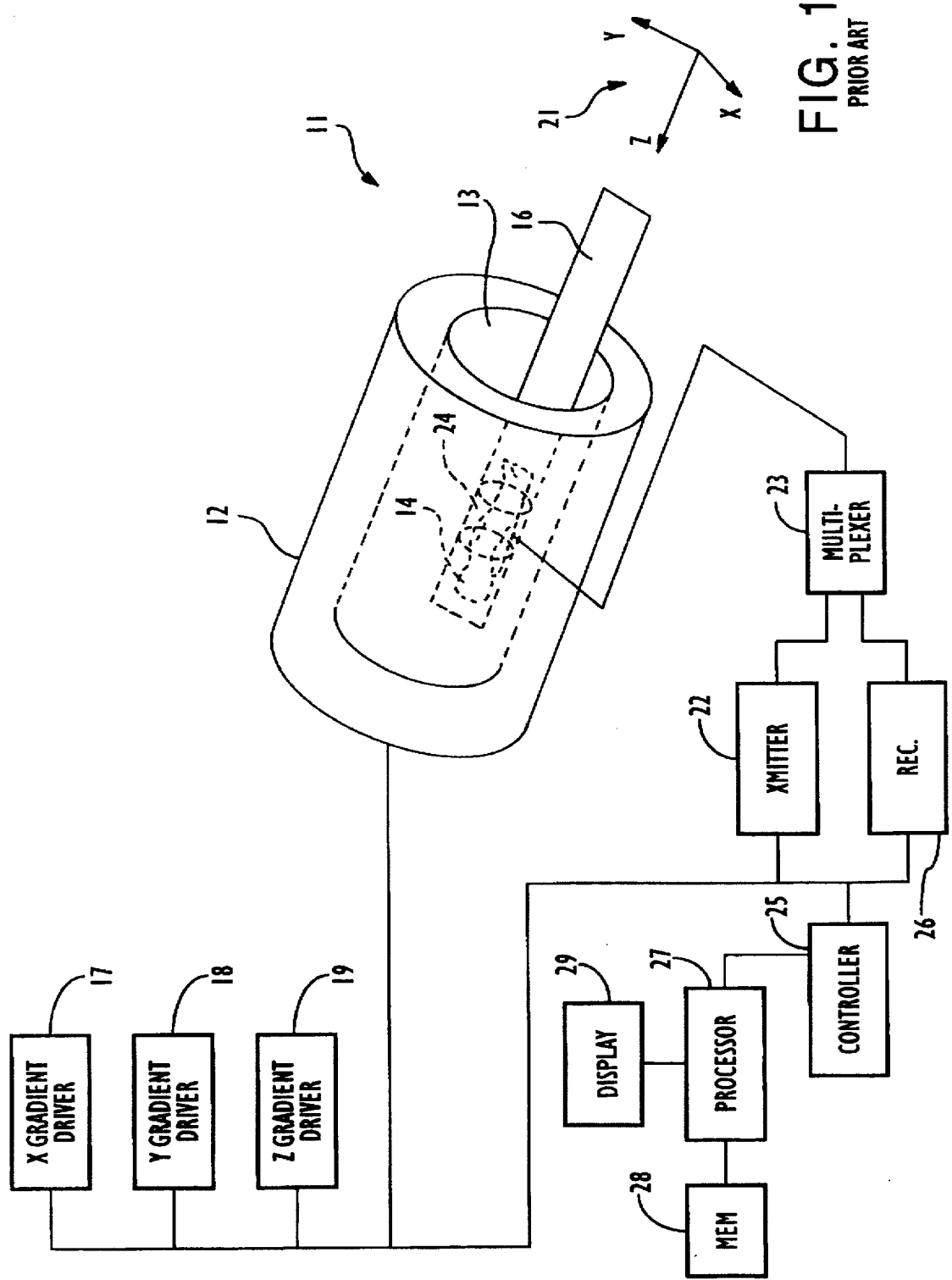
FIG. 1 is a block diagram representation of a typical MRI system.

FIG. 1 at 11 shows a typical MRI system in block diagram form. The main magnet 12 is preferably a super-conducting magnet, although within the scope of the present invention, the magnet can be of other well known types. The magnet 12 contains a bore 13 enabling the entry of a patient into the magnetic field. The super-conducting magnet provides a large homogeneous static magnetic field. A patient shown at 14 is inserted into the bore 13 using bed arrangement 16 so as to be within this large static magnetic field. The large static magnetic field causes "spins" in the patient to be statistically aligned with the large static magnetic field.

Encoding signals within the magnet are provided by the gradient coils (not shown per se) within the magnet. The X, Y and Z gradient coils are driven by X gradient driver 17, Y gradient driver 18 and Z gradient driver 19, respectively. The X, Y and Z nomenclature refers to the imaginary orthogonal axes shown at 21 used in describing MRI systems; where the Z axis is an axis co-axial with the axis of the bore hole. The Y axis is the vertical axis extending from the center of the magnetic field and the X axis is the corresponding horizontal axis orthogonal to the other axes.

Radio frequency pulses generated by transmitter 22 and applied through multiplexer 23 and radio frequency coil apparatus 24 act to tip the aligned spins so as to have a projection, for example, in the X, Z plane; the X, Y plane or the Y, Z plane. The spins when realigning after the radio frequency pulse is removed generate free induction decay (F.I.D.) signals which are received by the radio frequency coil apparatus 24 and transmitted through the multiplexer to the receiving circuit 26. From the receiving circuit the received signals go through the controller 25 to an image processor 27. The image processor works in conjunction with a display memory 28 to provide the image displayed on display monitor 29. It should be noted that the radio frequency coil apparatus 24 can comprise separate coils for transmitting and receiving or the same coil apparatus 24 could be used for both transmitting and receiving the RF signals.

Figure 2A:
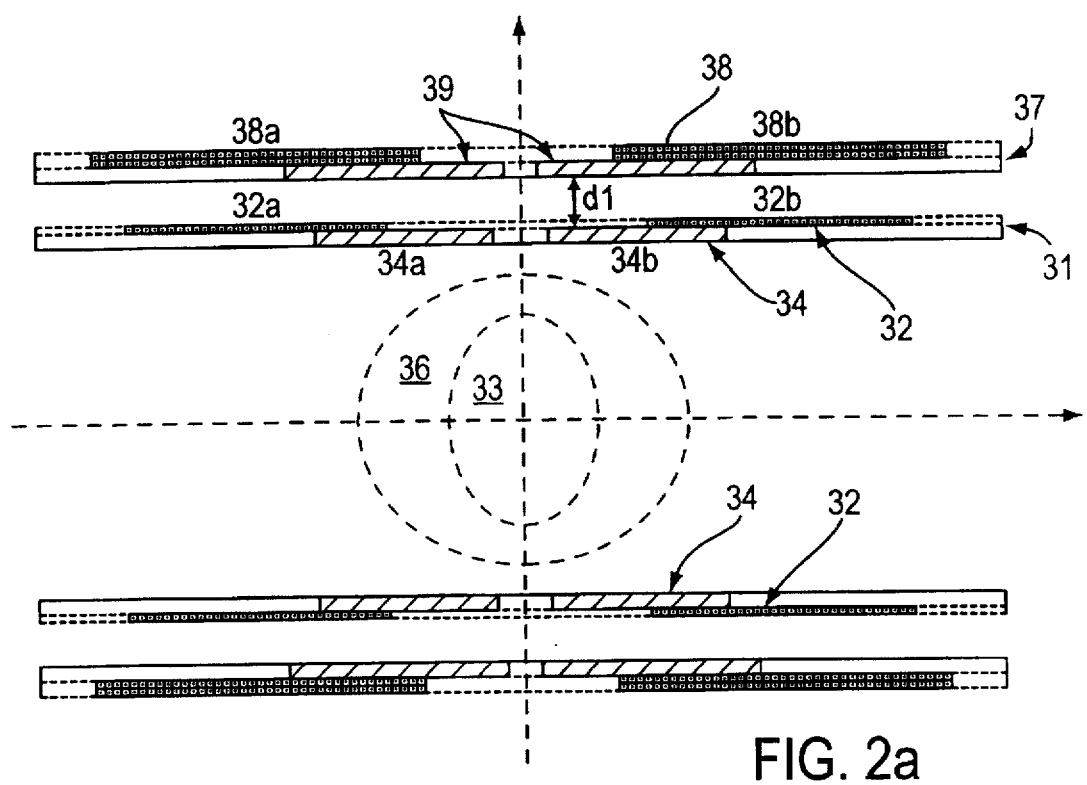
FIG. 2a is a schematic cross sectional view of a modular set of gradient coils along with an associated modular set of screen coils.

FIG. 2a shows the inventive modular gradient coil set 31. Thus the illustrated modular gradient coil set 31 is shown as a gradient coil in a cross sectional view of a portion of the magnet 12. The modular gradient coil set 31 is comprised of modular gradient coils 32 and 34. Screen coils 38 and 39 are associated with the gradient coils in a manner designed; among other things, to reduce eddy currents generated by the gradients.

In one embodiment the modular gradient coil set includes both a longer modular gradient coil 32 extending on the flanks of the set and a centrally located smaller gradient coil 34 operating together and used for conventional imaging operation. The modular gradient coil 34 provides linear gradients in only the central portion of the bore shown as portion 33 in FIGS. 2a and 2b. The modular gradient coils 32 and 34 together act as the modular gradient coil set and provide a comparatively large linear region 36. The flanking coil 32 does not have to extend over the entire central portion of the magnet since for conventional use the central coil 34 and the flanking coil 32 co-operate to form the required larger region of linear gradients.

For ultra high-speed imaging, only coil 34 is energized. Coil 32 is disconnected. With coil 34 operating at a higher power, i.e. with more current going through it, high-speed imaging such as that obtained with echo planar imaging sequences is possible even with the power supply normally used for conventional imaging. When coil 34 alone is energized and used in a ultra high-speed imaging sequence such as an echo planar imaging sequence, the current going through coil 34 is much larger than for the conventional operation. In addition, the region energized 33, is much smaller than the region 36 obtained when both modular gradient coils 32 and 34 are energized. Fast switching speed is possible because of the lower inductance of coil 34 as compared to the inductance of coils 34 combined with coil 32 or coil 32 alone.

A feature of the present invention in one embodiment includes the use of modular screen coil set 37 on a coil former not shown, which is at a larger radial distance than the radial distance used for the operational modular gradient coil set 31. The screen coil set is shown at 37 and comprises modular coils such as coils 38 and 39 for operation in co-operation with the modular gradient coil set 31 comprising coil 32 and coil 34 respectively. The screen coils, as is well known, operate to restrict eddy currents and stray flux fields.

Figure 2B:
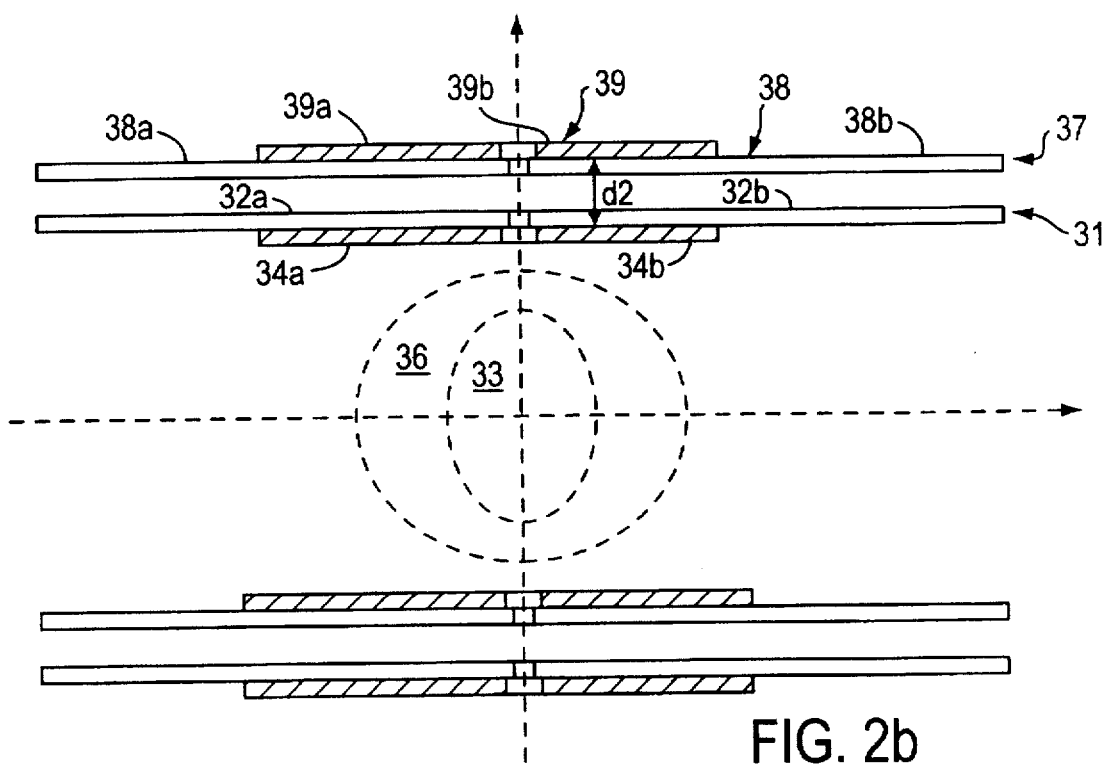
FIG. 2b is a schematic cross sectional view of another embodiment of the modular set of gradient coils along with an associated modular set of screen coils.

FIG. 2b illustrates an arrangement for further improving the efficiency of coil 34. As shown its associated modular screen coil 39 is at a greater radial distance from the center of the magnet than in the embodiment of FIG. 2a ($d_2 > di$). Thereby the separation between gradient coil 34 and screen coil 39 is increased but the overall radius of the complete modular coil structure remains unchanged. Thus, the order of the screen coil layers can be varied to optimize the efficiency of the coil 34.

Figure 2C:
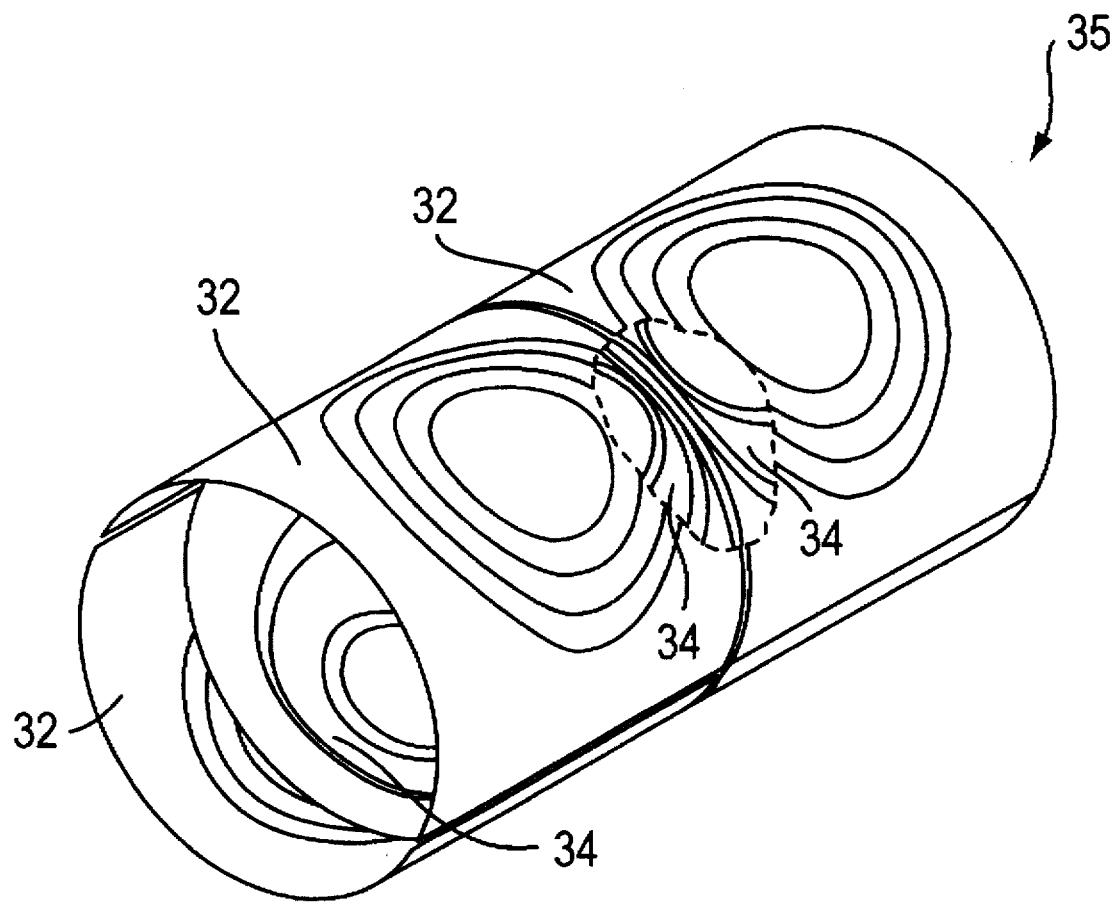
FIG. 2c is a schematic three dimensional view of the primary modular gradient coils.

FIG. 2c. The pictorial representation of the set of modular gradient coils of FIG. 2c illustrates on exemplary embodiment. Therein the coils 32a and 32b, which make-up the outer or flanking coil 32, are shown as printed or inserted on the outer side of former 35. The inner or central coil 34 is represented by portions 34a and 34b printed or inserted on the inner side of former 35. An important characteristic is that the length of coil 34 is shorter than the length of coil 32. Note that for purposes of clarity, the screen coil set 37 is omitted from this drawing.

Figure 3A:
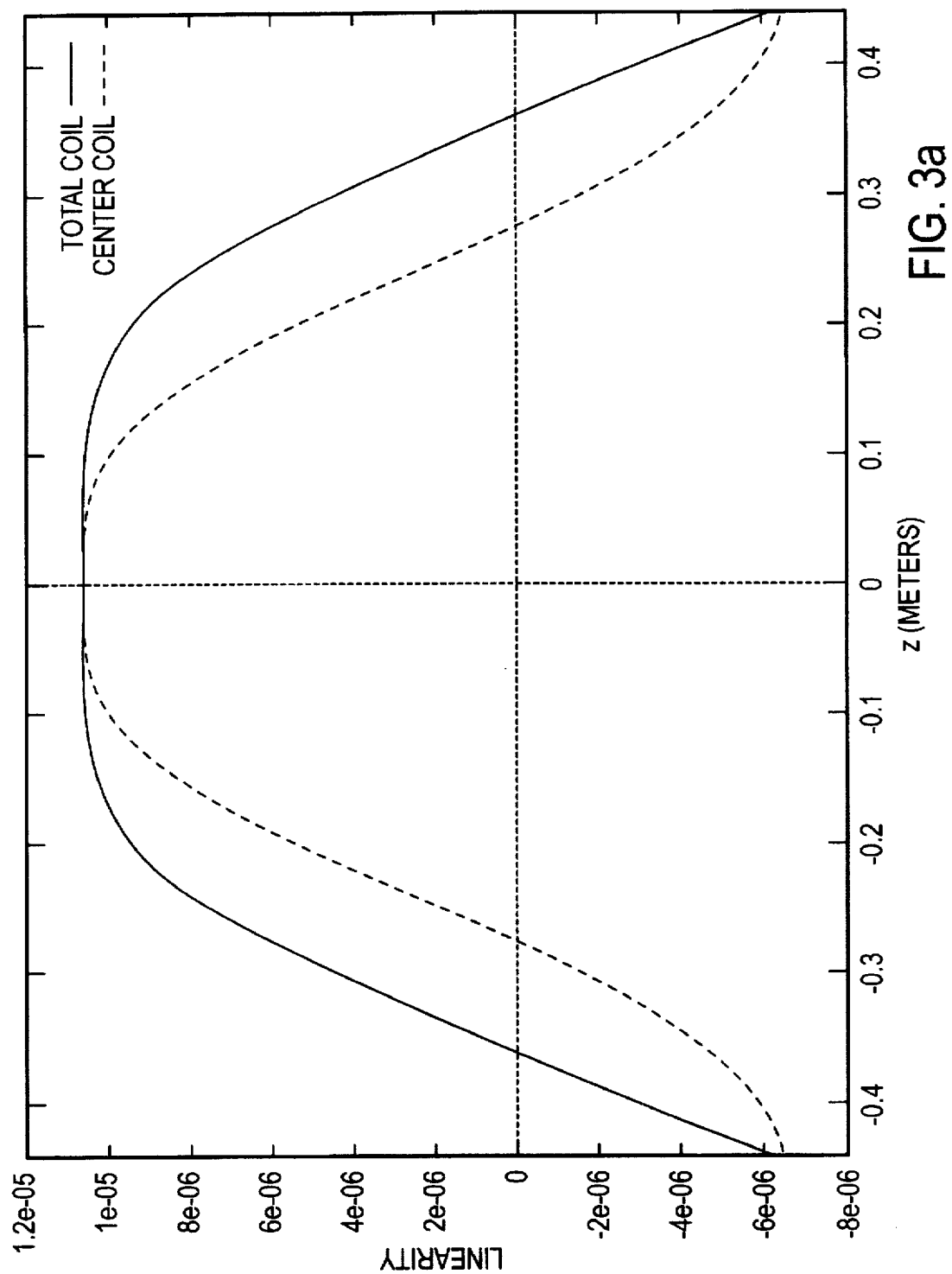
FIG. 3a are graphical representations of the linear regions obtained when using the set of modular transverse gradient coils with the center or first modular gradient coil energized and with the total coil energized.

FIG. 3a illustrates in solid line form the length of the linear region (½ of the top of the plateau) of the flux generated by central modular coil 34 when combined with the flanking modular coil 32. The length of the linear region of the center modular coil 34 alone is illustrated in dashed lines form. The coils 32 and 34 are shown as generating a much larger linear region when operating together, whereas coil 34 operating alone is shown as generating a much smaller linear region. More particularly, as shown in FIG. 3a coil 34 operating alone generates a region that is linear only for approximately 15 units, (0.1 meter=10 units) whereas coils 32 and 34 in combination generate a linear region that extends for approximately 30 units of length.

Figure 3B:
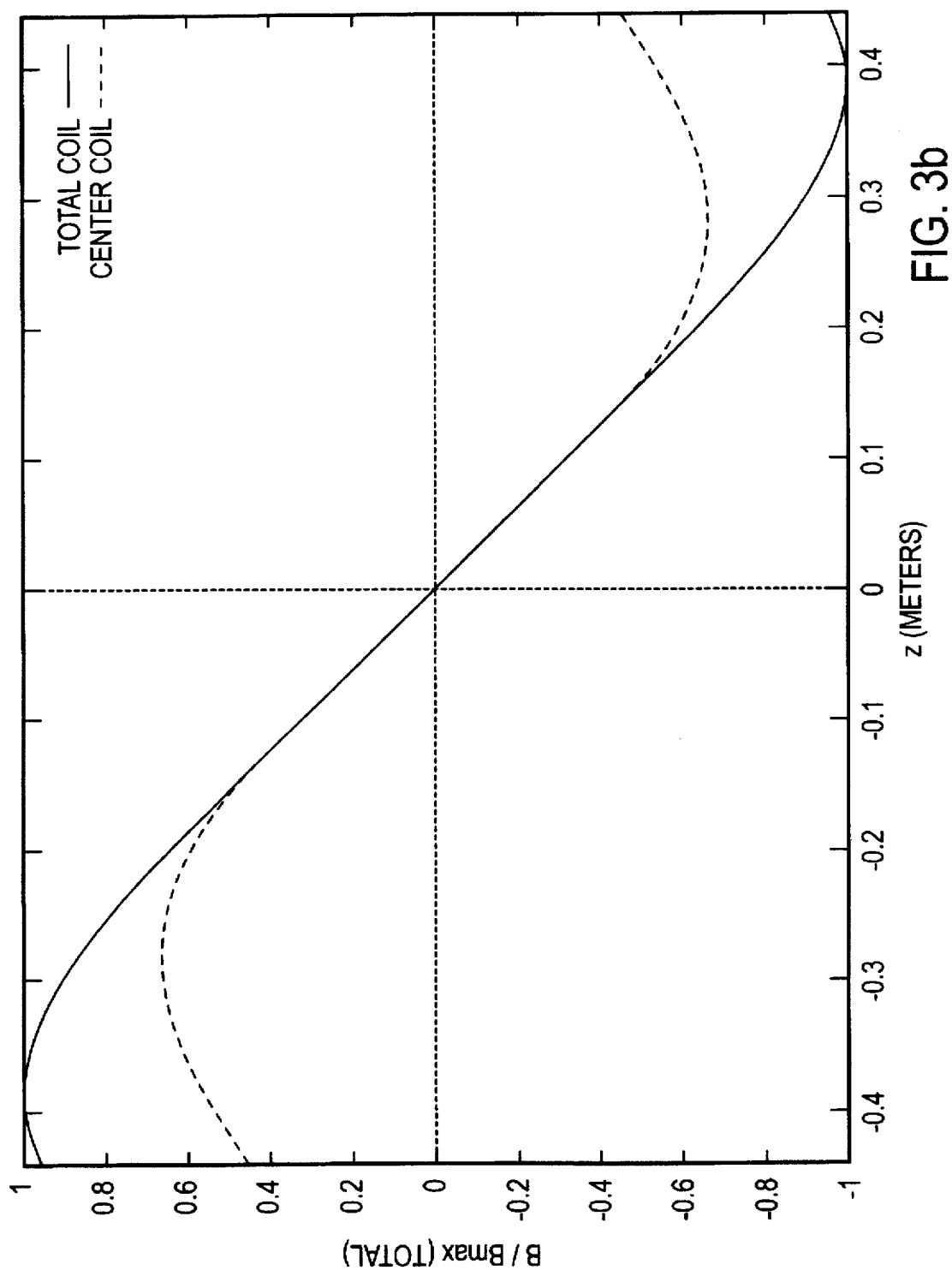
FIG. 3b is a graphical comparison of the ratios of the magnetic field to the peak field generated by the first modular gradient coil and the peak field generated by the total coil; i.e. the modular set of transverse gradient coils.

FIG. 3b shows a normalized plot of a maximum magnetic field within the patient bore for equal gradient strength of the two modes of operation. In particular, it shows that the maximum magnetic field is reduced when central coil 34 is used alone (dashed line) compared to coils 34 and 32 used together (solid line).

Figure 4A:
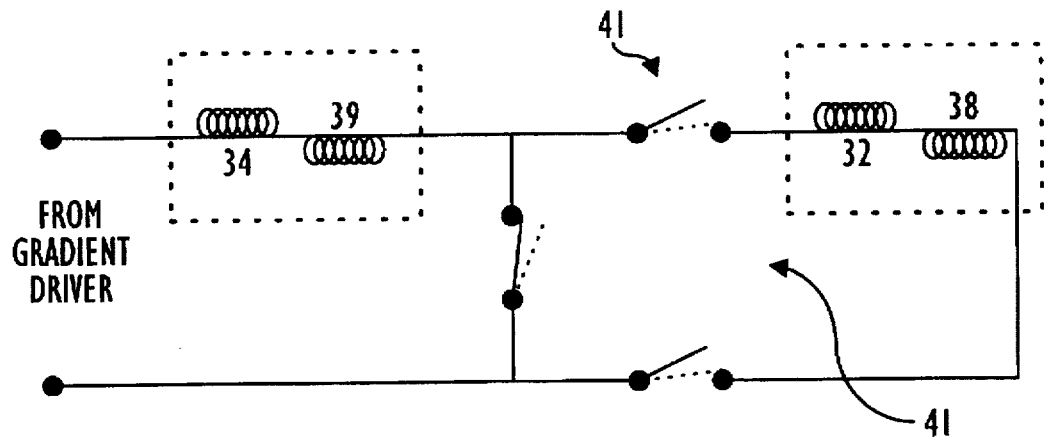
FIG. 4a is a schematic showing of the switching arrangement for operating the modular set of gradient coils with the modular gradient coils in series with each other and with their respective screen coils or, alternatively, operating only the first modular gradient coil alone but in series with its screening coil.

FIG. 4a schematically shows a switching arrangement for selectively coupling together the gradient coils to control the size of the region of linear gradients. More particularly, a schematic representation of switching arrangement 41 for switching the coils is shown. In one position of the switching arrangement 41 shown by dashed lines, both the coils 32 and 34 are operated in series while connected in series to their associated screens 39, 38. In the second position of the switches shown by solid lines only the coil 34 and its associated screen 39 is energized and operated. When only coil 34 is energized the modular gradient coil is set for ultra-high speed operation. When conventional operation is desired both coils 32 and 34 are used.

Figure 4B:
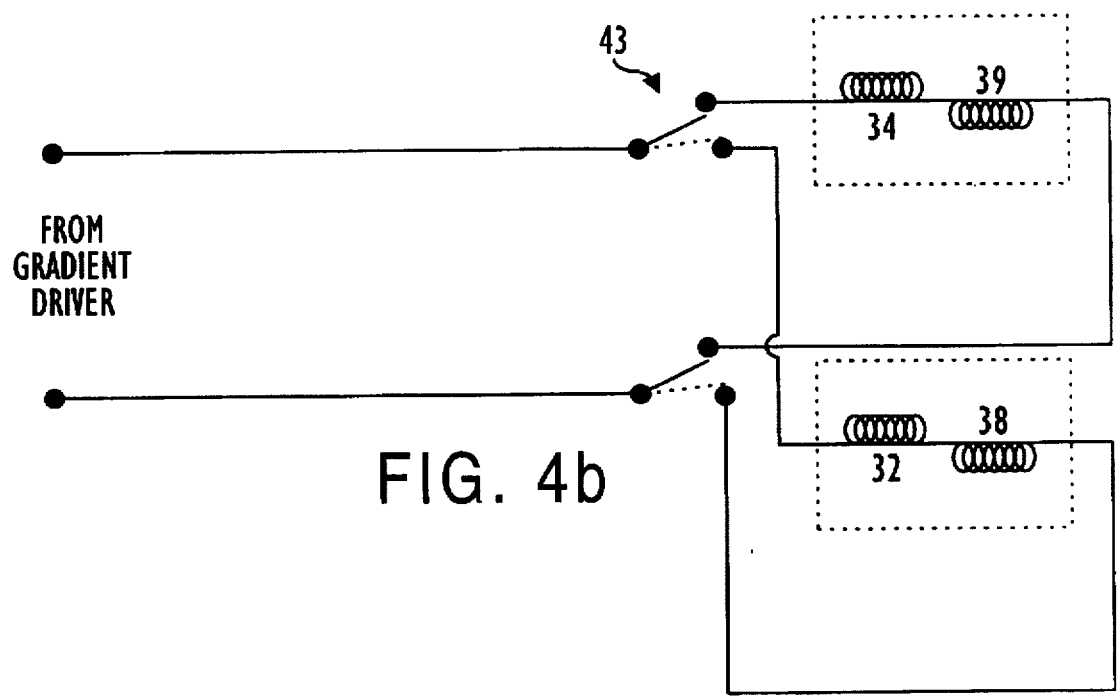
FIG. 4b is a schematic showing of the switching arrangement used to operate only the first modular gradient coil alone but in series with its screening coil, or the second modular gradient coil alone and in series with its screening coil.

FIG. 4b shows the longer switching arrangement 43 for either connecting only the gradient coil 32 for conventional imaging where coil 32 is designed to operate alone for conventional imaging; (as shown in FIG. 2b) or only connecting coil 34 for ultra-fast operation of the imaging system 11.

The gradient coils and the screen coils connected together either in parallel or in series within the scope of the invention.

In operation, for conventional imaging, the modular gradient coil set 31 includes both gradient coils 32 and 34 and their associated screen coils 38 and 39. For ultra-fast imaging only gradient coil 34 and its associated screen 39 are energized. Within the scope of the invention gradient coil 32 and its screen coil 38 could be operated alone for conventional imaging. In that case coils 32 and 38 would extend to generate more linear flux in the central part of the magnet bore.

In the FIGS. 4a and 4b the screen coils 38, 39 are illustrated as wound in a direction opposite to the winding of the operational gradient coils to effectively screen the gradient coils. Also, it should be understood that the switches are schematically shown and many types of switches including computer controlled switches could be used.

While the invention has been described using an exemplary embodiment, those skilled in the art will readily appreciate that many variations and modifications may be made in this exemplary embodiment while retaining many of the novel features and advantages of this invention. For example, while cylindrical coils are illustrated that are planar or elliptical in cross section other shapes could be used. Accordingly, all such modifications and variations are intended to be included within the scope of the appended claims.

What is claimed is:

1. A magnetic resonance imaging (MRI) system comprising:
   a magnet for supplying a large homogeneous static magnetic field to align spins in a subject that is within the interior space of the magnet,
   a radio frequency transmitter for generating radio frequency signals at Larmor frequencies,
   a radio frequency coil for transmitting the radio frequency signals to tip said aligned spins to have at least a projection on a plane normal to the static magnetic field,
   at least one modular gradient coil set for varying the static magnetic field to enable encoding free induction decay (FID) signals emitted by the tipped spins,
   said at least one modular gradient coil set comprising a single structure including a plurality of modular gradient coils that are mounted on a single gradient coil former that is fixed relative to said magnet,
   a first of said plurality of modular gradient coils providing a first region within the static magnetic field having linear gradients in a first direction for use in ultra-fast MRI,
   a second of said plurality of modular gradient coils being longer than said first of said modular gradient coils and extending beyond both flanks of said first of said modular gradient coils, to provide a second region larger than and overlapping said first region within the static magnetic field, said second region having linear gradients in said first direction for use in conventional MRI,
   switching means for selectively coupling said first and second modular gradient coils so that said first modular gradient coil is separately energized, said second modular gradient coil is separately energized or both coils are energized jointly, and
   said first and second modular gradient coils being mounted on said single gradient coil former, one of said first and second modular gradient coils being mounted on the inside of said single former and another of said first and second modular gradient coils being mounted on the outside of said single gradient coil former.

2. The MRI system of claim 1 including:
   a screen coil set that is modular and mounted on a single screen coil former that is fixed relative to the magnet, said single screen coil former having a larger diameter than said single gradient coil former so that said screen coil set is on the outside of said at least one modular gradient coil set.

3. The MRI system of claim 1 wherein said single gradient coil former is cylindrical.

4. The MRI system of claim 3 wherein said first modular gradient coil is a printed coil.

5. The MRI system of claim 3 wherein said second modular gradient coil is a printed coil.

6. The MRI system of claim 4 wherein said second modular gradient coil is a printed coil.

7. The MRI system of claim 1 wherein said first modular gradient coil is centrally disposed and said second modular gradient coil overlaps said first modular gradient coil.

8. A gradient coil arrangement for magnetic resonance imaging (MRI) systems having a magnet for generating a static magnetic field and an RF coil arrangement for generating RF fields, said gradient coil arrangement used for varying the static magnetic field, and comprising:
   a single structure comprising a set of fixed modular gradient coils providing a single whole body operating volume having linear gradients,
   a first coil of said set of fixed modular gradient coils positionally fixed relative to said magnet, said first coil of said set of fixed modular gradient coils providing a first region within said operating volume in the static magnetic field having linear gradients extending in a first direction for use in ultra-fast MRI, and
   a second coil of said set of fixed modular gradient coils positionally fixed relative to said magnet, said second coil of said fixed modular gradient coils extending beyond said first coil on both flanks providing a second region larger than and overlapping said first region within said operating volume in the static magnetic field said second region having linear gradients extending in said first direction, on the flanks further than the linear gradients of said first region for use in conventional MRI, and said first and second modular gradient coils being mounted on one gradient coil former with said first modular gradient coil being mounted on the inside of said former and said second modular gradient coil mounted on the outside of said former.

9. The gradient coil arrangement of claim 8 including:
   a screen coil set mounted on a single cylindrical screen coil former, said single cylindrical screen coil former having a larger diameter than said one gradient coil former, said one gradient coil former positioned inside said single screen coil former and having a first screen coil for screening said first gradient coil,
   said first screen coil mounted on the inside of said screen former, and
   a second screen coil for screening said second gradient coil,
   said second screen coil mounted on the outside of said screen former.

10. The gradient coil arrangement of claim 8 wherein said former is cylindrical.

11. The gradient coil arrangement of claim 10 wherein said first modular gradient coil is a printed coil.

12. The gradient coil arrangement of claim 10 wherein said second modular gradient coil is a printed coil.

13. The gradient coil arrangement of claim 11 wherein said second modular gradient coil is a printed coil.

14. The gradient coil arrangement of claim 8 wherein said first modular gradient coil is centrally disposed relative to said second modular gradient coil.

15. The gradient coil arrangement of claim 8 including switching means for selectively coupling said first and second modular gradient coils so that the first modular gradient coil is separately energized or both modular gradient coils are energized jointly.

16. The gradient coil arrangement of claim 15 wherein said switching means couples said first and second modular gradient coils in series.

17. The gradient coil arrangement of claim 8 wherein each of said modular gradient coils has associated therewith a screen coil.

* * * * *